United States Patent [19]

Hinds

[11] Patent Number: 4,654,571
[45] Date of Patent: Mar. 31, 1987

[54] SINGLE PLANE ORTHOGONALLY MOVABLE DRIVE SYSTEM

[76] Inventor: Walter E. Hinds, 1358 Schuyler Rd., Beverly Hills, Calif. 90210

[21] Appl. No.: 776,365

[22] Filed: Sep. 16, 1985

[51] Int. Cl.$^4$ ............................................. G05B 11/00
[52] U.S. Cl. .................................... 318/687; 318/653; 318/640
[58] Field of Search ............... 318/135, 687, 653, 640; 310/12, 13

[56] References Cited

U.S. PATENT DOCUMENTS

| | | | |
|---|---|---|---|
| Re. 27,289 | 2/1972 | Sawyer | 318/135 X |
| Re. 27,436 | 7/1972 | Sawyer | 318/135 X |
| 4,485,339 | 11/1984 | Trost | 318/653 |
| 4,506,204 | 3/1985 | Galburt | 318/135 |
| 4,506,205 | 3/1983 | Trost et al. | 318/653 |
| 4,507,597 | 3/1985 | Trost | 318/653 |
| 4,535,278 | 8/1985 | Asakawa | 318/687 |
| 4,555,650 | 11/1985 | Asakawa | 318/135 |

Primary Examiner—Benjamin Dobeck
Attorney, Agent, or Firm—Bogucki, Scherlacher, Mok & Roth

[57] ABSTRACT

An aligner or positioning system for moving a member in any direction in a horizontal plane includes a planar member having an upper horizontal surface and a platform movable above the horizontal surface. Driving coils extending along either of two orthogonal directions are disposed in one of the members while a pattern of oppositely magnetized permanent magnet elements is disposed in the other in flux coupling relationship. Energization of windings in appropriate senses, in accordance with the position of the platform, generates relative movement in one or both of two orthogonal directions, which may include angular movement as well.

33 Claims, 9 Drawing Figures

SINGLE PLANE ORTHOGONALLY MOVABLE DRIVE SYSTEM

BACKGROUND OF THE INVENTION

In many applications, particularly precision optical systems such as are used in semiconductor processing, inspection and testing, it is desirable to be able to move an object very precisely with respect to two orthogonal axes while maintaining the object in a reference plane. Step and repeat projection systems provide a good example of the need for a positioner or aligner that must meet such critical and difficult requirements. Such systems are used in the semiconductor industry for repeatedly projecting the image of a photomask onto a wafer at different positions. The array of patterns on a silicon or other semiconductor wafer must be successively laid down in columns and rows with submicron accuracy. Semiconductor wafers of 6" diameters are now being utilized and up to 8" diameters will be used in the future.

Because constantly smaller images are being generated, ever greater accuracy in positioning is being demanded. With 6" wafers, for example, high density circuit patterns are laid down at center-to-center spacings of the order of 0.10". Thus approximately 2500 images must be exposed or processed sequentially with a positioning accuracy of 0.1 micron in order that the complete processing sequence, which typically involves many projection steps, can be carried out with precise alignments and high yields. It is also sometimes required to be able to rotate the image through a small angle (e.g. 3°) in order to align the pattern for various purposes.

These requirements for accuracy and reliability of operation are such that older bearing mounted positioners with compounded XY stages cannot be as precisely level as needed, much less provide rapid but highly precise movement between successive exposure positions. It has been recognized that a platform supported on air bearings above a stable, precisely flat surface might achieve suitable positioning speed and accuracy. However, this remains no more than a desirable goal at the present time, inasmuch as an air bearing mounted XY drive system with limited angular motion is not yet commercially available. Moreover, there are many potential problems to be considered, such as the settling time required before the platform is truly stationary once it has been moved to a new position. With most XY stages, driving thrusts are exerted off axis relative to the center of gravity of the platform. Thus overturning moments are exerted that would induce a rocking action at some resonant frequency in air bearing mounts. Until this rocking action becomes damped to an adequately low level the next projection step cannot be undertaken.

Linear motors are well known as devices for providing precisely controllable longitudinal movement. Because the elements of the linear motor lie along a plane, and the motor can move the elements at high speed, its promise for use in precision positioning systems is recognized. Precision sensors employing laser interferometers can be used to provide signals for servoing position to submicron accuracy. However, no suitable configuration of two axis or X-Y linear motor drive is available or known. The added requirements of a semiconductor processing station, including the ability to maintain the image in an almost perfectly flat plane, rotate the image through a small angle, and position rapidly with minimal settling time, also remain to be met.

A two-dimensional linear stepping motor system was initially proposed by Sawyer in U.S. Pat. No. Re.27,436, and has been used since principally for controlling the mechanism in a flatbed plotter. In this system two orthogonally disposed linear stepping motors are defined within a movable platform above a planar base. The platform can be actuated in X or Y separately or in a vectorially combined direction, but only in stepping fashion. Even using known microstep techniques, however, this mechanism cannot meet the precision and velocity requirements of the semiconductor industry without much refinement and excessive cost. It also cannot rotate relative to the XY plane, and thus would require an added mechanism for this purpose.

A system for positioning an element in two dimensions in semiconductor manufacturing apparatus is disclosed in recently issued U.S. Pat. No. 4,535,278 to Asakawa. In this proposal an array of permanent magnets is arranged in a spaced apart rectangular pattern, with magnets of like polarities disposed along diagonals. Driving coils in the form of flat, square sided, loops are mounted on the underside of a movable member. Four such coils are shown, with outer dimensions, widths and spacings being precisely related to the particular magnetic fields of the array so as to generate predictable instantaneous force vectors, depending on incremental position and instantaneous driving current, for each coil. By manipulating individual driving currents constantly as position changes, net drive force vectors are said to be generated that induce the needed motion in the driven device. This system is said to be capable of controlling angular position as well as X and Y positions. It is, however, extremely complex because it is based on multiple non-linear interactions which vary with position. The four sided coils may interact at any instant with from none to four permanent magnets to give a predictable but highly variable resultant force vector. Each of the four sides of a coil sees a different instantaneous force vector that varies in both angle and amplitude and must be resolved by signal processing into individual driving signals that somehow yield the desired net X and Y forces. Thus the driving current for each coil must constantly be computed and changed, requiring input signals to be converted depending on position in accordance with complex "distribution factors" in "multiplier type digital-analog converters". For high precision the system requires virtually infinite resolution, and it appears likely that some positions may exist at which pure X and Y forces cannot be resolved. Furthermore, the forces exerted are not symmetrically applied relative to the center of the device and settling times are highly uncertain.

SUMMARY OF THE INVENTION

A system in accordance with the invention provides an XY positioning table a two-dimensional planar array of selectively magnetized areas, with like magnetization of elements in columns and rows, facing a two-dimensional planar array of selectively energizable driver coil sets lying in a horizontal plane. The coil sets have active turn lengths lying along either the columns or rows of the array. A platform for an object to be positioned, such as a wafer, contains one part of the drive system while the table contains the other. Current through the driver coil sets is varied in accordance with instantaneous platform position and desired position to induce the desired motion. The interaction between the magnetic elements and the active turn lengths generates thrust in either or both of the two orthogonal directions to position the platform in the horizontal plane. In addition, differential actuation of individual coil sets in the driver coils may be used to introduce limited angular motion in the platform. The platform is supported on air bearing mounts above the table, and the magnetic field interaction takes place just above the surface of the table, constantly directing thrust through the virtual center of the moving structure. The coil sets are divided into multiple subsets which are energized by associated commutating circuits in such fashion that thrust is constant for a given driving current amplitude.

In one example of a system in accordance with the invention, the positioning system comprises a flat fixed surface plate having an embedded array of magnetic elements of individual rows and columns, with elements of opposite magnetization being offset along different orthogonal lines to provide a checkerboard array having interspersed non-magnetic areas. The movable platform is disposed above this fixed surface, and comprises, at its underside, a number of selectively disposed and symmetrically mounted coil sets disposed in quadrants about the center of gravity. Each pair of two diagonally disposed coil sets includes active turn lengths parallel to one of the two orthogonal directions to generate balanced thrust in the other orthogonal direction. Positioning is controlled by sensing the instantaneous position of the platform using laser interferometers, deriving the drive signals needed for movement to a desired position, and controlling excitation of the coil sets without processing of the drive signals. Movement at angles to the X and Y axes is generated by concurrent control of the relative amplitudes of the forces exerted in the X and Y directions. Rotation of the movable stage is effected by unbalanced energization of the primary elements in the corner quadrants. Multi-turn coil sets are employed for greater thrust, the windings in the coil sets being energized under control of a commutating system. The position of the platform is calculated in each of the two orthogonal directions relative to the magnetic elements and drive signals are commutated between windings without cogging effects.

In another example of a system in accordance with the invention, the coil drivers are disposed in the flat surface in mutually orthogonal directions, and a pattern of magnetized elements is mounted on the underside of the movable platform. Again, the platform is positioned using commutated drive signals computed from sensing of instantaneous position. This arrangement has the advantage that the winding structure is fixed, but a disadvantage is that the exerted energizing windings extend through the length of the array, reducing efficiency.

Another feature of the invention is that dimensional stability for the table is achieved utilizing a magnetic back plate provides a temperature stable substrate for the checkerboard of magnetic elements, the spaces between which are filled with insulating material such as glass. The checkerboard array is covered by a thin, dimensionally stable top surface such as glass which serves as the reference plane for an air bearing support system for the superimposed movable platform.

BRIEF DESCRIPTION OF THE DRAWINGS

A better understanding of the invention may be had by reference to the following description, taken in conjunction with the accompanying drawings, in which.

DETAILED DESCRIPTION OF THE INVENTION

Figure 1:
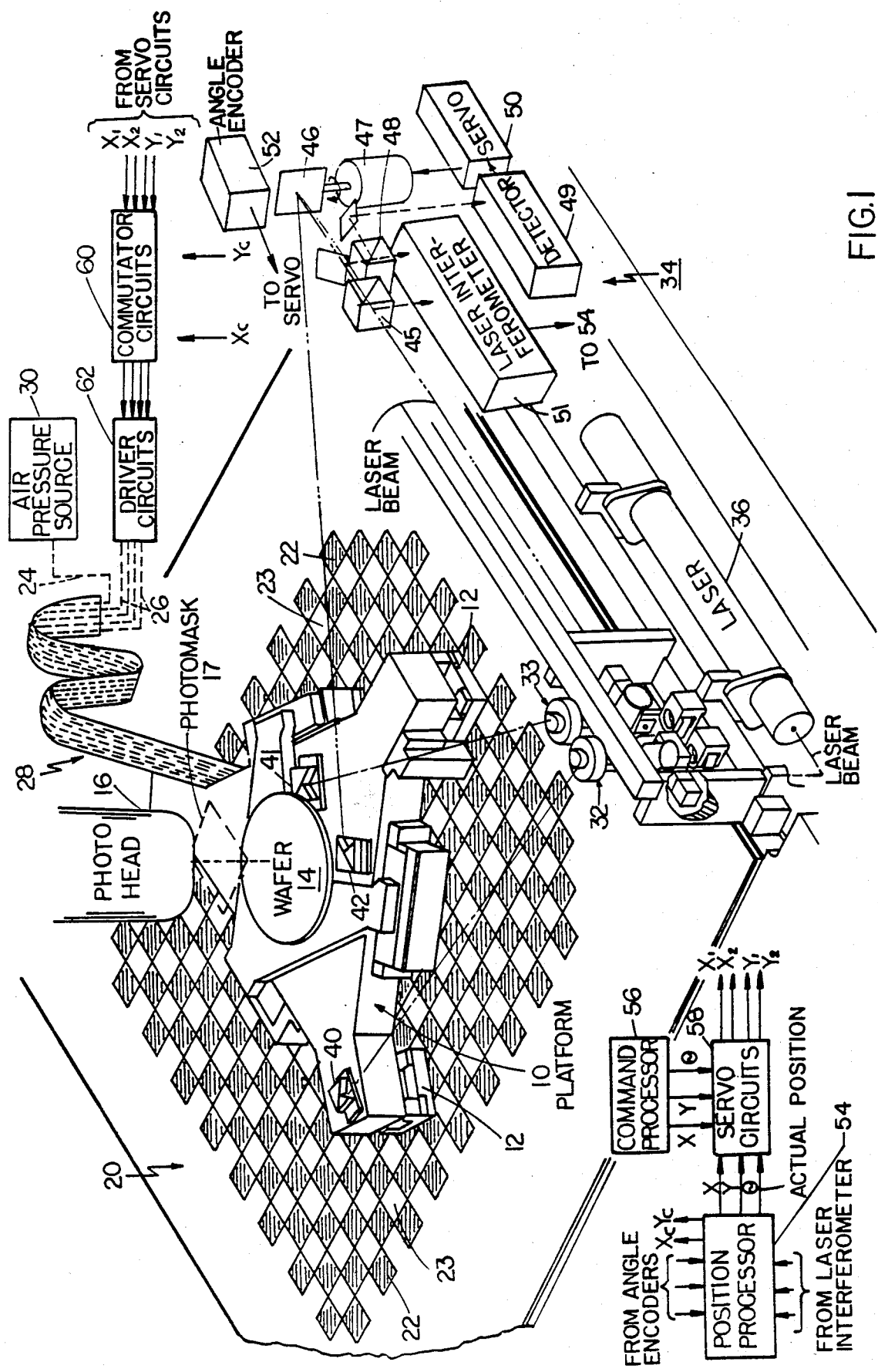
FIG. 1 is a combined block diagram and perspective view, partially broken away, of a positioning system in accordance with the invention.

A positioner in accordance with the invention, as utilized in conjunction with a step and repeat system for die-by-die alignment on a semiconductor wafer is shown in general form in FIG. 1. A generally triangular platform 10 floats on air bearing mounts 12 positioned at each outwardly extending leg of the platform. A semiconductor wafer 14 resting on a top surface on the platform is to be positioned precisely, at different X and Y positions, relative to the optical axis of an overlying photohead 16, shown only in generalized form inasmuch as a wide variety of these systems is known. In addition, the wafer 14 is to be rotated through a small angle, such as a maximum of 3°, so as to precisely align the dies (not shown) on the wafer 14. In a typical situation, the wafer is covered with a photosensitive layer (not shown) and the photohead 16 exposes a precision pattern defined by a photomask 17 (shown only generally). In a step and repeat process, similar exposures are made at a rectangular array of die positions on the wafer 14. These patterns may be the first on the wafer 14, or may be deposited over prior layers. After complete exposure in the step and repeat sequence, a washing step removes material, as determined by the exposure pattern, following which the next deposition step in the process can be utilized. The wafer 14 is of standardized form, having a major flat and a minor flat along different peripheral sections from which the XY position and angular attitude can be precisely calculated.

The triangular platform 10 floats on the air bearings 12 on a table surface 20 which has a precisely flat and horizontal upper surface and includes embedded magnetic elements 22 separated by non-magnetic elements 23 in a precise pattern as defined hereafter. The platform 10 includes, as described in greater detail hereafter, coil sets which form linear motor structures with the permanent magnet elements 22. Air pressure for the air bearings 12 is provided through an air line 24 and driving signals for the linear motors are provided through electrical lines 26 arranged in a flexible umbilical cord 28, the majority of the weight of which may be suspended from an overhead device (not shown).

With this system, the platform 10 is free to be positioned anywhere on the table surface 20, and in order to control such position with high accuracy remote sensors in the form of three beam steered laser interferometers 32, 33, 34 receiving coherent light from a common laser 36 are utilized. Each laser interferometer 32, 33 or 34 directs a collimated narrow beam onto a different V-shaped reflector 40, 41 or 42 respectively. The V-shaped reflectors each have a small spherical curvature at the apex of the V, such that light impinging on the reflector is reflected directly back to the source even though the platform 10 may be misaligned within the 3° limit relative to the X and Y axes defined on the table surface 20. The beam from the laser 36 is divided by beam splitters (not shown in detail) into separate beams for each interferometer 32, 33, 34, and guided by appropriate angled mirrors (also not shown in detail). At the third laser interferometer 34, which is shown in simplified schematic form as typical of all three devices, the beam passes a beam splitter 45 toward a variable angle galvanometer mirror 46, from which it is directed to the associated reflector 42 on the platform 10. The galvanometer 47 rotates the coupled pivoted mirror 46 about a central vertical axis so as to steer the beam onto the center of the V on the reflector 42. The direction is controlled by reflecting the returned beam off the pivoted mirror 46 and passing it onto a radiation sensitive detector 49. The detector 49 feeds servo circuits 50 controlling the galvanometer 47 in accordance with signal amplitude so as to track the platform reflector 42 with the beam. The other beam from the mirror 46 is directed through the beam splitter 48 to the interferometer circuits 51 which are of conventional design, and which also require a reference from the first beam splitter 45. The waves and phases of the two beams are compared to provide data for use in determination of XY and angle ($\theta$) position of the platform 10. The angle of the galvanometer 47 can be used for computation or control, for which purposes an angle encoder 52, preferably of the optical type, is coupled to the galvanometer 47 to provide a digital signal. To compute instantaneous position, however, only the three distance signals from the interferometer circuits 51 need be applied to a position processor 54, such as a microprocessor. The processor 54 is programmed to compute, by software, firmware or hardwired circuits, the instantaneous position of the wafer 14 on the X and Y axes relative to the optical axis of the photohead 16. The processor 54 also computes angular deviation of the wafer 14 about the central vertical axis defined by the optical axis.

Presently used laser interferometers establish positional accuracy within small fractions of a micron. While the laser sampling time is relatively slow, typically being measured in tens of cycles per second, the mechanical system is extremely stable and settling time is not a significant factor.

The instantaneous position computed by the position processor 54 is compared to command positions provided in digital form by a command processor 56, which indicates the positions desired in X, Y and $\theta$.

Servo circuits 58 compare the actual to desired position signals and generate one pair each of X and Y drive signals for energizing the coil sets on the platform 10. These pairs of X and Y signals, designated $X_1$, $X_2$, $Y_1$, and $Y_2$ are applied through commutator circuits 60 to driver circuits 62, to energize appropriate windings in each of the coil sets, dependent upon instantaneous platform position. Different individual drivers in the driver circuits 62 energize specific windings in each of the coil sets dependent upon their physical relation to adjacent permanent magnet elements 22 on the table surface 20. The commutation times are determined by the position processor 54 which provides an X or Y signal, designated $X_c$ or $Y_c$ to denote each physical position at which signal commutation should take place, this corresponding to the pitch of the windings.

Figure 2:
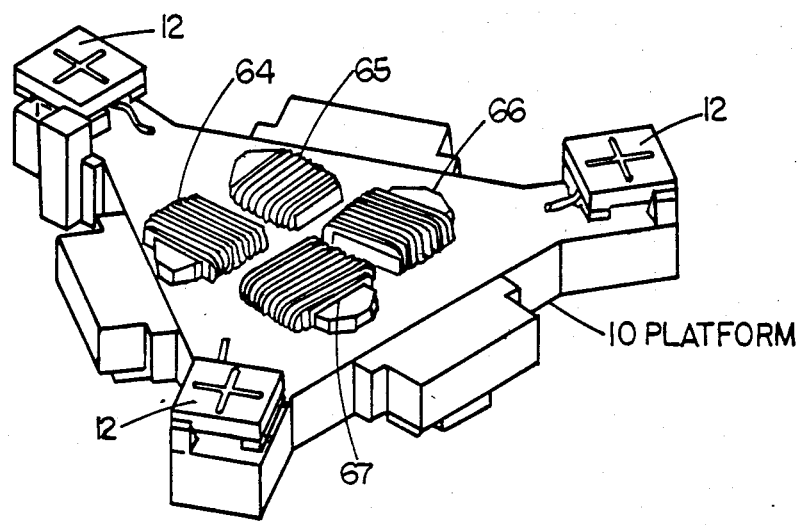
FIG. 2 is a perspective view of the underside of a movable platform used in the system of FIG. 1.

FIG. 2 depicts the underside of the platform 40 and the manner in which four coil sets 64, 65, 66 and 67 are disposed in a specific array on the underside thereof. The four coil sets 64–67 are disposed symmetrically about the vertical axis of the center of gravity of the platform 10. Two coil sets 64, 66, in diagonally opposed quadrants relative to the center, lie with active lengths of turns parallel to a given axis (here X) on the underlying table surface 20. It can be seen from the view in FIG. 2 of the underside of the platform 10 that the turns or active lengths of the coils 64, 66 are those linear lengths that are closest to the table surface 20. These lengths move in a plane just above the table surface 20 and exert thrust on the platform 10 in the direction perpendicular to their length (e.g. along the Y axis). The other diagonally opposed coil sets 65 and 67 are oriented with the active lengths of the windings parallel to the orthogonal or Y axis and therefore control X axis motion. All of the coil sets lie in the same plane just above the table surface 20, being held in position by the cruciform air bearings 12 which are capable of "flying" the platform 10 above the precisely flat table surface 20 at spacings of the order of 5–10 microns if desired.

Figure 3:
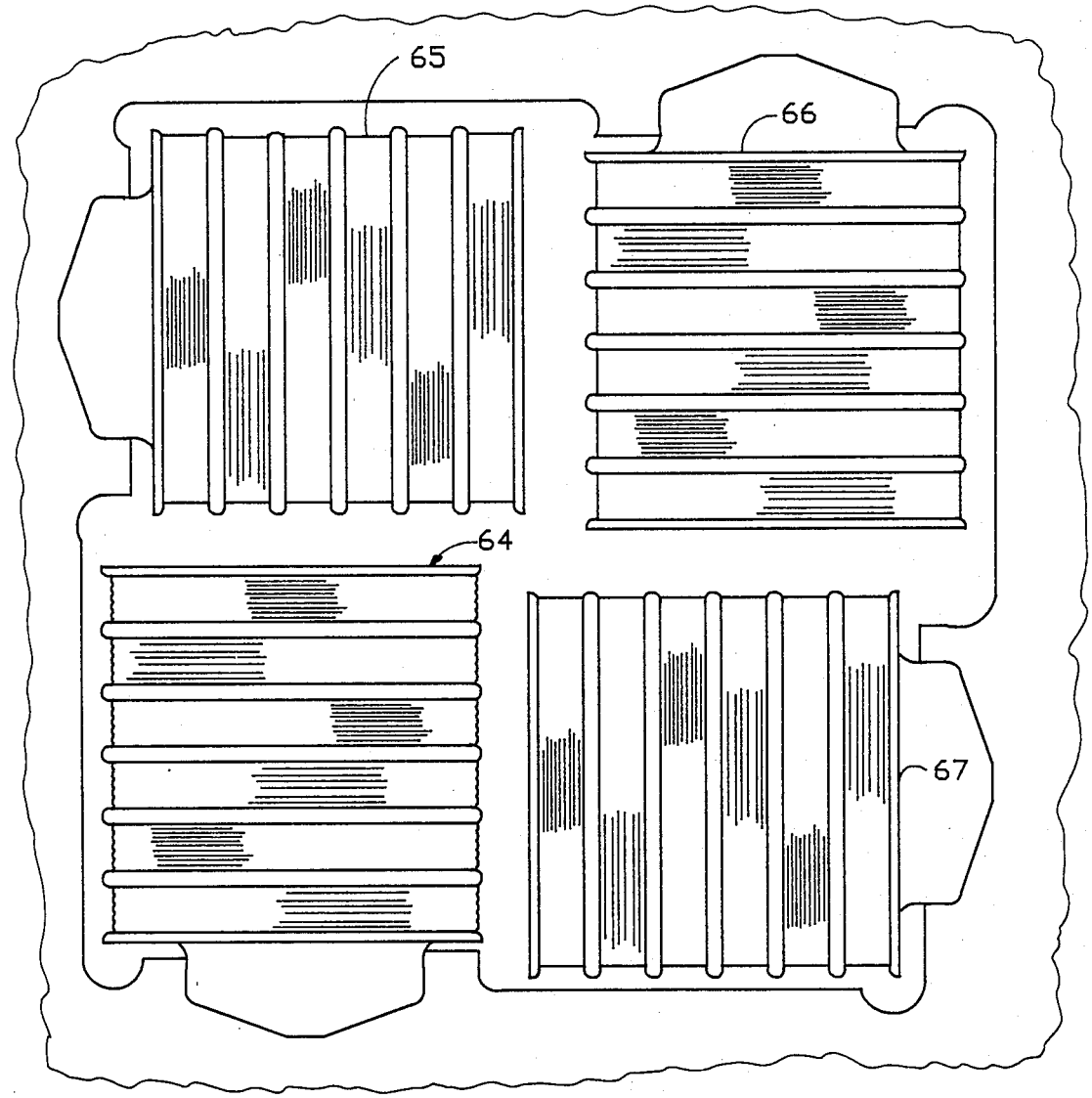
FIG. 3 is a plan view of energizing winding sets used on the movable platform of FIG. 2, showing further details thereof.
Figure 4:
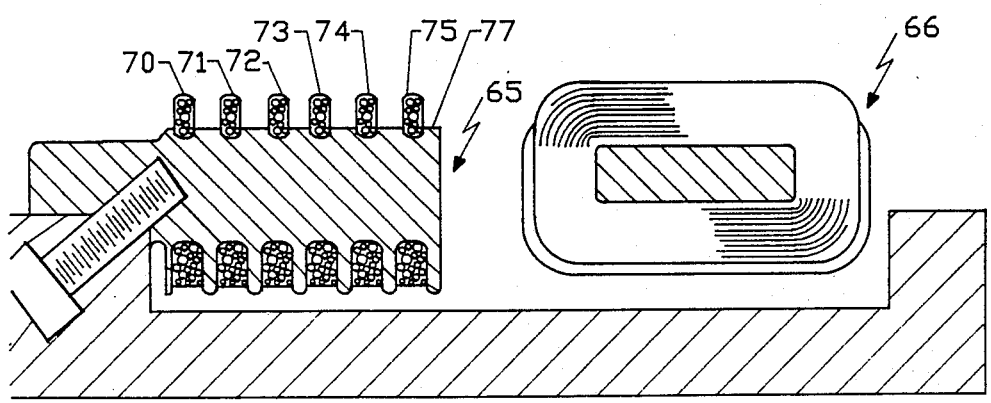
FIG. 4 is a side sectional view of the energizing winding sets of FIG. 3.

Further details of the coil sets are seen in the plane and cross sectional views of FIGS. 3 and 4. Each coil set is divided into six separate windings 70–75 wrapped around a common bobbin 77. Only one of these coil sets need be described inasmuch as the others are arranged in like fashion. The separate windings 70–75 are disposed with a uniform pitch ($\theta$) in a three phrase, Gramme-wound configuration. That is, as shown in FIG. 4, the polyphase winding is distributed by returning the winding from the active length back around the bobbin 77 at the opposite side, and disposing corresponding windings of each set of three in opposed phase relation. This arrangement enables two out of the three phases to be energized at all times, and thrust to be constant, whichever windings are energized, a feature which cannot be realized with other types of polyphase distributed windings.

The area of each coil set 64–67 is of a selected nominal value, and is furthermore related to the area and geometry of the permanent magnet elements 22 on the table surface 20. In this instance, the permanent magnet elements are square in outline and 1" on a side, while the individual coil sets are square in outline and 2" on a side. The permanent magnet elements 22 are disposed in a checkerboard arrangement of columns and rows, with each permanent magnet element 22 alternating with a like non-magnetic area 23, and with the permanent magnet elements 22 alternating in polarity along the columns and rows alternating as well. This arrangement assures that each coil set covers an equal area of permanent magnets 22 of different polarity at any position. For most economic commutation, the coil sets are separated in the X and Y directions by the same spacing (i.e. 1") as the length of the side of an element 22.

The construction of the table surface 20 includes the permanent magnet elements 22, non-magnetic spacers 23 and other features that enable the table surface 20 to complete the complex linear motor combinations and to function as a precise horizontal reference for movement of the platform 10. As best seen in the side view of FIG. 6, the table comprises a heavy base 80 having concavities 82 on the underside thereof. The upper surface 84 of the base is machined and lapped flat and horizontal. The base 80 may be molded of cast iron but is non-warping and temperature stable, and much easier to fabricate than the surface granite blocks widely used in optical systems. The permanent magnet elements 22 and non-magnetic spacers 23 are secured on the upper surface 84 of the base 80, as by epoxy or other high strength adhesive. If it is desired to use a granite base, however, a magnetic back plate (not shown) can be inserted between the magnetic elements and the base, to complete the flux paths.

The side dimensions of the table 20 are ultimately determined by the maximum size of the semiconductor wafer 14 that is to be used. As seen in FIG. 1, in which the wafer 14 is of 6" diameter, the permanent magnet elements 22 are 1" on a side and in a 16×21 array, and there is approximately a 6" margin on three sides and a 3" margin on the fourth side. This slightly non-symmetrical arrangement enables the platform 10 to be shifted in all directions so that the coil sets 64-67 remain in operative relation to the permanent magnets 22, while the legs of the platform can ride out to the side margins of the table 20 at the limit positions. The narrower margin along one side can be used because the geometry of the triangular platform 10 and the permissible but small angle of rotation do not require a greater margin on this side. With this configuration, much larger semiconductor wafers can be used in the step and repeat system than the 6" wafers now predominantly used and the 8" wafers now in development, provided that the wafer is approximately centered on the platform. Thus a centered 10" wafer on the platform need only be moved 5" in any radial direction from the optical axis of the photohead 16 or a total of 10", whereas a minimum of 16" is currently available. The present arrangement, however, does enable the wafer 14 to be loaded virtually anywhere on the top of the platform 10, and still have all areas accessible to the optical axis of the photohead 16.

The non-magnetic spacers 23 separating the permanent magnet elements 22 may be of any suitable material, such as fiberglass reinforced resin, ceramic or the like. With the elements 22 and 23 in position, this surface is subjected to a final precision lapping which assures that the surface plane of the elements is flat and horizontal. A thin (e.g. 1/16") float glass or other non-magnetic top surface layer 90 is superimposed on the elements 22, 23 to serve as the reference base for the air bearing mounts 12 for the platform 10. The float glass 90 cover does not interfere with magnetic intercoupling between the coil sets 64-67 on the platform 10 and the permanent magnet elements 22 on the table 20.

Vectorial movement of the platform 10 and the wafer 14 in the horizontal plane above the table 20 is controlled by energization of the coil sets 64-67 on the underside of the platform 10. This may be better understood by reference to FIG. 5, which shows the active lengths of windings in the first and third coil sets 64, 66 as disposed along the X axis, with the windings in the second and fourth sets 65, 67 being disposed along the Y axis (the directions being designated arbitrarily but in any event being orthogonal). Thus the first coil set pair 64, 66 has active turns which generate a force in the Y direction when current is carried in these windings and the inducted magnetic flux coact with the magnetic field emanating from a permanent magnet 22. Concurrently, the linear lengths of the other pair of coils sets 65, 67 generate forces in the X direction when they carry current. The direction, whether forward or reverse, along the given axis, and the level of thrust, are determined by the number of turns, the magnetic field strength, and the amplitude of the current, as well as the length of winding coextensive with the magnetic element.

Figure 5:
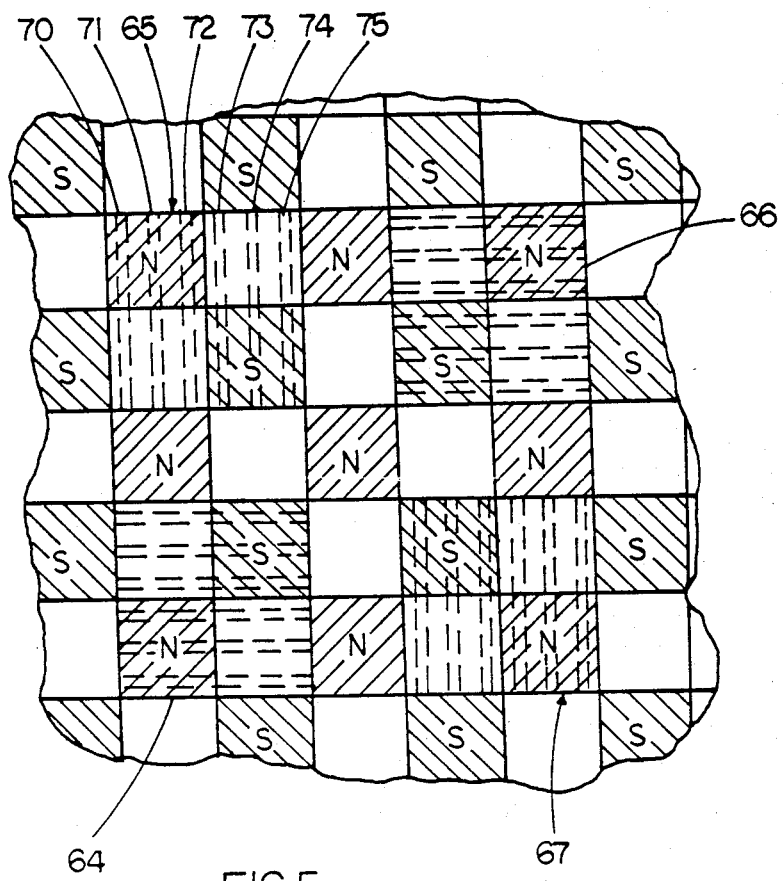
FIG. 5 is a fragmentary plan view of the table surface of FIG. 1, showing the relationship of the energizing winding sets in different positions to magnetized areas on the table surface.

Referring to FIG. 5, it is seen that superimposing the coil sets 64-67 over the permanent magnet elements 22 demonstrates that, as previously stated, a given coil set covers an equal area of north polarized and south polarized elements 22. To move in a single direction, such as the X direction, the individual windings 70-75 (FIG. 4) in each coil set 64 and 67 (FIGS. 2, 3 and 5) with active turns parallel to the Y axis are energized in accordance with the instantaneous position of those coil sets relative to the permanent magnet elements 22. Consequently as seen in the superimposed view of FIG. 5, turns 70 and 71 which are coextensive with north polarized regions are energized with currents in one direction while turns 73 and 74 which are coextensive with south polarized elements, are energized with currents in the opposite direction. All currents are of amplitude determined by the driving signal. The thrust generated in all windings which coact with adjacent permanent magnet 22 of either polarity thus contribute to movement in the selected direction. In order to obtain movement precisely along the X axis, both coil sets 65, 67 are equally energized. Thus, the vectorial components of force exerted by each coil set 65, 67 are equally spaced from and on opposite sides of the center of gravity and no turning moment about the center of gravity is introduced. Likewise, Y direction forces are generated by the other two diagonally disposed coil sets 64, 66, which are also symmetrical relative to the center of gravity of the platform 10.

It may therefore be seen, in the superimposed view of FIG. 5, that X and Y thrusts may be vectorially combined by concurrent energization of all coil sets. When X and Y thrusts are equal, because of equal energization, the direction of movement is at 45° to the X and Y axes. With greater amplitude currents in one pair of coil sets than the other the resultant direction is predetermined at some other angle.

When it is desired to provide a corrective angular motion, however, energization of the windings of each coil set of a pair 64, 66 or 65 and 67 is made unequal, to introduce a turning moment about the center of gravity of the platform. Unequal currents between the turns in at least one diagonally opposed pair of coil sets exert unequal thrusts, imposing a rotational force in the horizontal plane on the platform 10. Here it should be noted that the turns 70-75 become slightly canted relative to the X or Y axes so that there is a slight nonlinearity in thrust. Because the angular deviation is limited to a maximum of 3°, however, the loss of thrust is small and the effect of the nonlinearity in the servo control system is minimal.

Figure 6:
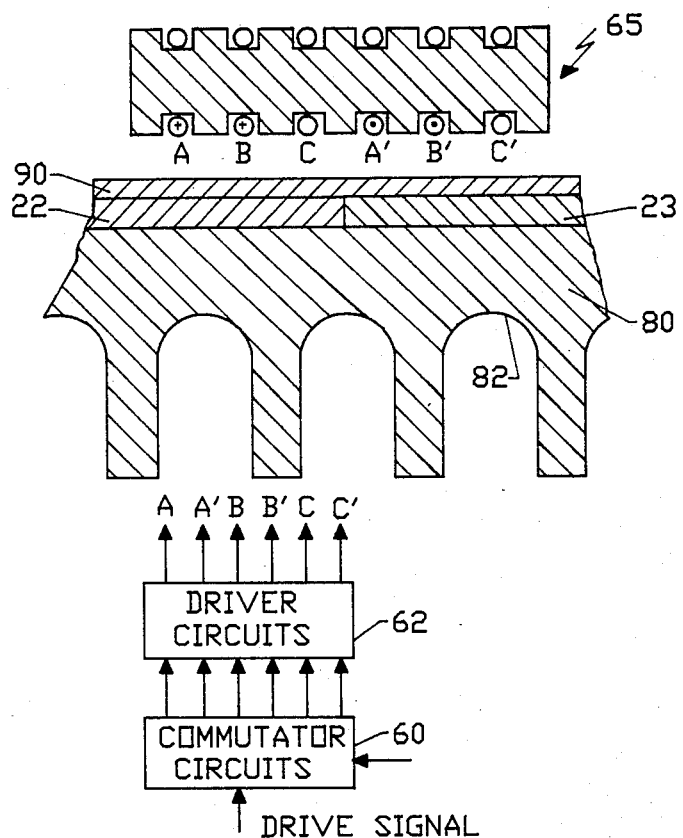
FIG. 6 is a side sectional view of a portion of the table surface of FIGS. 1 and 6 showing further details thereof.

It will be appreciated, from the view of the magnetic flux distribution seen in FIG. 6, that the magnetic fields at the back side of the permanent magnetic elements are completed through the magnetic base 80 in a closed path. The base 80 also dissipates heat internally generated in the system. On the upper side of the magnetic elements 22, however, the magnetic flux bridges from each element outwardly to the four adjacent permanent magnet elements of opposite polarity. The bridging flux paths differ in direction in accordance with position relative to the area of a permanent magnet element 22. Because all such elements 22 have a like symmetry and because forces are exerted only where lengths of wire are immediately adjacent and coextensive with the permanent magnet element, thrust remains constant, regardless of position, for a given current.

The forces exerted on the movable platform 10 by the active lengths of wire immediately above the permanent magnet elements 22, act symmetrically relative to the center of rotation (except for angular moments) of the platform 10. It should also be appreciated that the weight of the windings and the bobbins on which they are wound concentrate the mass at the lower region of the platform 10, assuring that the center of gravity is close to the plane of the table 20. Overturning moments that would tend to rock the platform are therefore small, and furthermore are resisted by the air bearing mounts 12 at the extreme ends of the platform 10. Consequently, the platform 10 can be moved from one position to another, in the step and repeat process, with settling time being minimal.

Overall operation of the system can best be appreciated by reference to the system view of FIG. 1. The photohead 16 and associated optics and photomask 17 to be exposed are centered on the optical axis. The wafer 14 on the platform 10 is then to be moved to different positions in the step and repeat sequence to form the array of die patterns on the wafer. It should parenthetically be noted that the positioning system could also be used for inspection purposes, as by positioning selected dies at an optical axis at which they are to be examined under a microscope by an operator or by automatic inspection apparatus. To precisely identify the position of the wafer 14 relative to the optical axis, a photodetector system (not shown) may trace the edge of the wafer 14, locating the major and minor flats and computing the precise center of the wafer 14, and its rotational position, for the position processor 54.

In starting the step and repeat alignment process of this example, the laser interferometers 32, 33 and 34 provide three different distance readings responsive to the positions of the reflectors 40, 41 and 42 on the platform 10. From these distance readings the position processor 54, by conventional triangulation calculations, generates X, Y and $\theta$ data representative of actual position for conventional servo circuits 58. The position processor 54 continues to operate repetitively in real time, repeatedly recomputing the actual position and providing the X, Y and $\theta$ data for the servo circuits 58. In addition, the position processor 54 generates commutation control signals, designated $X_c$ and $Y_c$ for the commutator circuits 60, these signals changing in accordance with the relative position of the coil sets to the permanent magnet elements. Inasmuch as the commutation is repetitive and in all instances predictable, conventional integrated circuit commutation circuits generating plus, minus and zero levels may be utilized, as shown in block diagram and schematic form in FIG. 6. The six winding configuration shown has two subsets of coils, one designated A, B and C, and the other A', B' and C', with the first and fourth being coupled together serially to provide current in opposite senses through the active turns facing the table 20. With a given pitch or spacing, $\tau$ between turns, the signal is commutated to a different driving combination for each $\tau$ increment of movement of the platform 10. Because each permanent magnet 22 is of a length to encompass a full subset of three adjacent windings, movement transverse to the length of a winding periodically changes the relationship between current direction and magnet polarity. At periodic points the commutation sequence turns off the leading winding of a subset before it enters the influence of the next oppositely poled magnet. Consequently, there are always two energized windings (out of the three of a subset) so that thrust remains constant for a given input level signal. For movement in the reverse direction, the commutation sequence is merely reversed because the leading winding then is at the opposite end of the set of three.

Returning again to FIG. 1, the command processor 56 provides the X, Y and $\theta$ commands to indicate the first or next position at which the wafer 14 is to be located. The servo circuits 58 respond to the difference between actual and desired position to generate X axis commands and Y axis commands as the amplitude varying signals designated $X_1$, $X_2$ and $Y_1$, $Y_2$. When $X_1$ is equal to $X_2$, for example, the coil sets 65, 67 are equally energized and no angular moment is introduced. As in other conventional servo circuits, the X and Y driver signals are varied in amplitude and in inverse relation to the extent of the error to achieve stable but rapid positioning without overshoot.

This arrangement therefore meets the many critical requirements imposed by the semiconductor industry for step and repeat and other systems in particularly advantageous fashion. The platform can be moved vectorially to any desired location in the horizontal plane and its rotational position can also be varied for precise alignment relative to the X and Y axes. All movement is within the horizontal plane, and the forces exerted are symmetrical with respect to the center of gravity within the plane and close to the center of gravity in the vertical direction. Consequently, overturning moments are small and easily overcome. All motion is referenced to a fixed and stable flat surface, and introduced friction held to a minimum by the air bearing supports, so that the wafer is held precisely at the focal plane and minimal adjustment is needed during operation.

Figure 7:
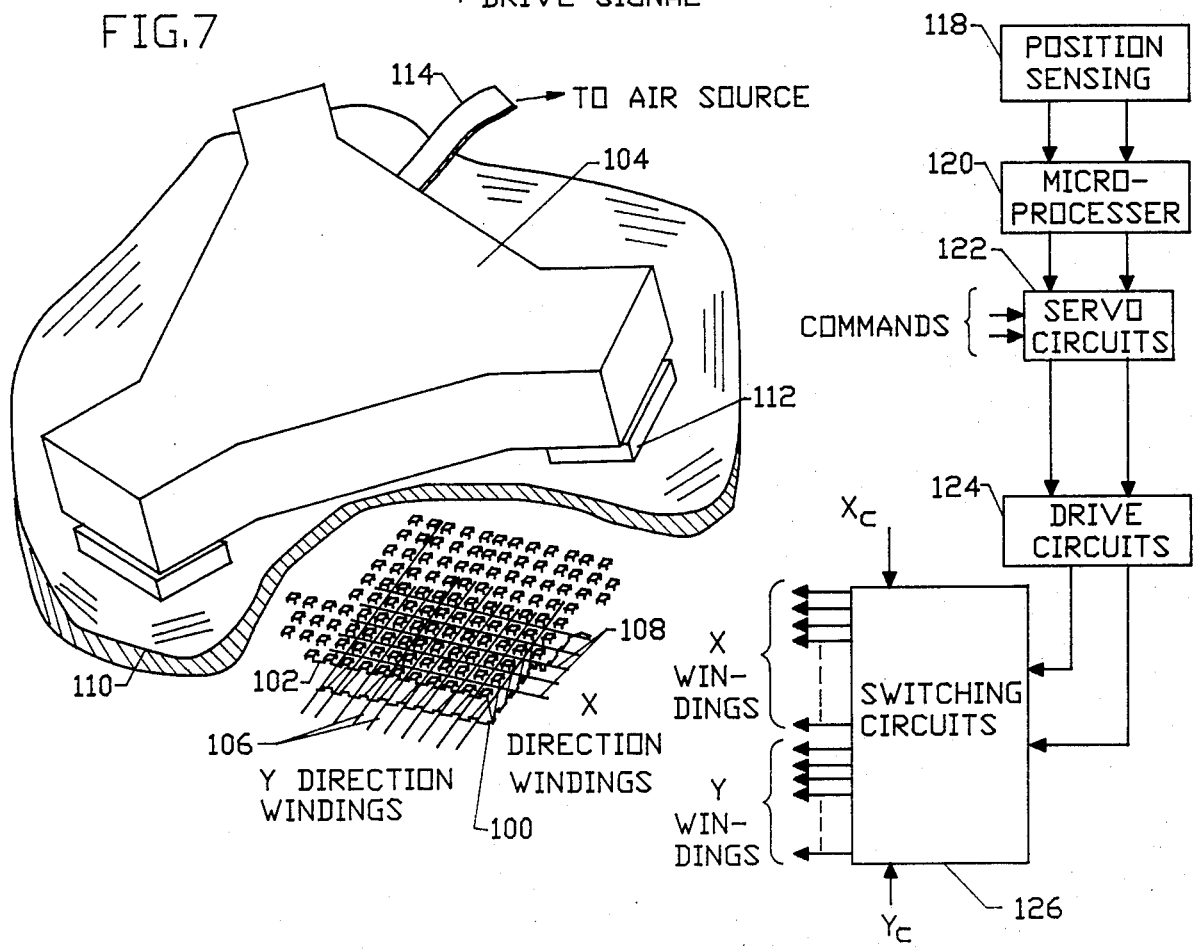
FIG. 7 is a perspective view, partially broken away of a different example of a system in accordance with the invention.
Figure 8:
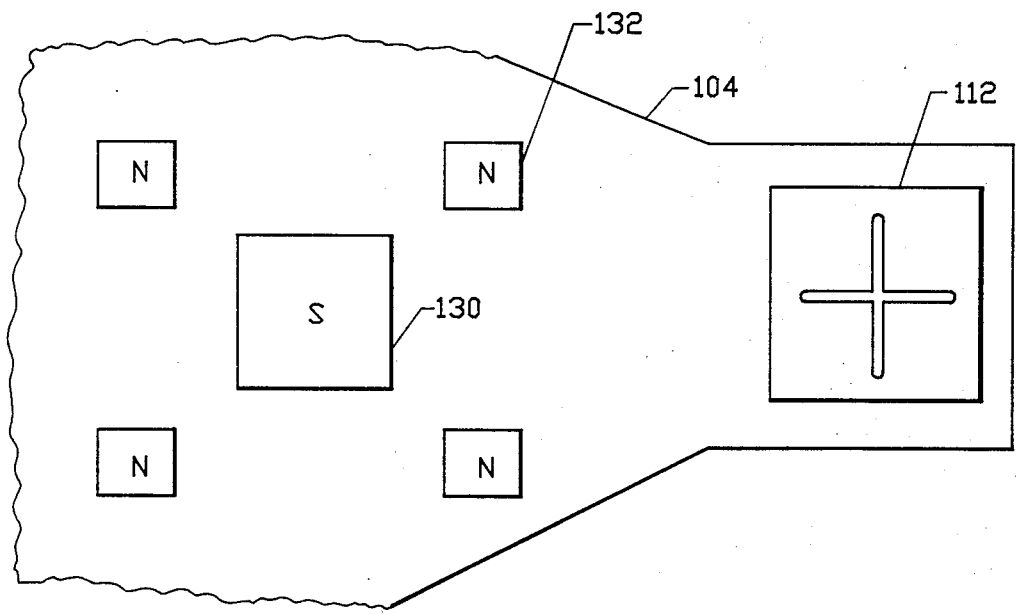
FIG. 8 is a perspective view of the lower portion of a platform used in the system of FIG. 7, showing the disposition of magnets on the underside thereof.
Figure 9:
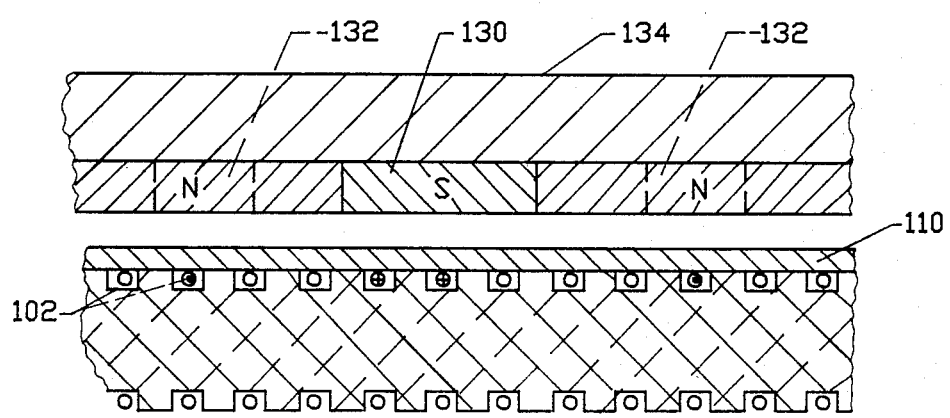
FIG. 9 is a schematic view of a surface table used in the system of FIG. 7 showing the disposition of energizing windings thereon relative to the permanent magnets on the platform.

A different example of a system in accordance with the invention is provided by the example of FIGS. 7 to 9, in which the platform is a passive member carrying a pattern of permanent magnet elements and the table comprises a number of windings in each of two orthogonal directions, on which a thin non-magnetic cover layer provides a base for air bearing support of the platform.

In the example of FIGS. 7-9 the base 100 has repetitive patterns of X and Y grooves 102 having a predetermined pitch and defining, in the area of intersection, the two-dimensional area in which a platform 104 is to be positioned. X direction windings 106 and Y direction windings 108 are disposed in the grooves 102, again providing polyphase distributed windings at a selected pitch. In this example, however, as seen in FIG. 9, the windings are disposed in phase groups of three, with the first winding in one group being coupled to the first winding in the succeeding group, but serially coupled so that the currents flow in opposite senses. The surface over the windings is covered by a float glass layer 110 providing a horizontal reference surface for air bearings 112 extending from the platform and powered by pressurized gas via an umbilical cord 114.

A position sensing and calculating system of the type used in the example of FIG. 1 may be employed in conjunction with the system, so that it is not shown in detail but merely depicted in generalized form as the combination of a position sensing system 118 and a microprocessor 120 for computing X, Y and $\theta$ values and commutation signals. Servo circuits 122 responsive to position command signals and the X, Y and $\theta$ signals generate X and Y drive signals that are applied through drive circuits 124 and which apply X and Y drive signals to switching circuits 126 that activate X and Y windings 106, 108 in the then active region of the base 100, dependent on platform 104 position. The signals are applied through commutator circuits 128 in the selected individual windings.

As seen in FIGS. 8 and 9, the permanent magnet elements on the underside of the platform 104 comprise a central, square outline, permanent magnet 130 of a first polarity and a predetermined length corresponding to one grouping of windings. The large central permanent magnet element 130 is oriented to be orthogonal to the X and Y axes, and individual ones of a group of four small permanent magnet elements 132 are disposed at the corners, each being intersected by a diagonal through the large element 130. Each of the smaller permanent magnets 132 is one-half the length, on a side, of the large permanent magnet 130, and spaced apart from the corner by like distances in the X and Y direction. Consequently, as seen in FIG. 9, the total areas of permanent magnets of opposite polarities are equal. Whatever the position of the platform 104, equal lengths of active windings are coextensive with the magnets of opposite polarity 130, 132.

The permanent magnets 130, 132 are secured to the underside of a magnetic back plate 134, which completes the flux path between the permanent magnets on their upper side. On the lower side, the extending or bridging flux paths intercept the active lengths of the opposing windings 106, 108 so as to generate thrust forces in the X and Y directions.

Operation of the system of FIGS. 7–9 can be seen to be comparable in functional effect to that of the system of FIGS. 1–6. For driving with constant thrust in a given direction, say the Y direction, the windings 104 disposed along the X axis are energized with signals at appropriate amplitudes and polarity from the sevo circuits 122 and drive circuits 124. To minimize $I^3 R$ loss, only those windings 106 needed to generate motion in the Y direction are energized, dependent upon platform 104 position. It is recognized that there is $I^3 R$ loss in those portions of the active windings which are not in direct opposition to and coactive with a permanent magnet element, but this cannot be avoided at reasonable expense. Generating thrust in the X direction is accomplished by energizing the appropriate Y axis oriented windings 108, and need not be further described. Generation of an angled motion, which is the vectorial sum of the thrust in the X and Y directions, is achieved by concurrent excitation of the X and Y windings 106, 108 respectively, to generate the Y and X axis thrusts with the relative amplitudes needed for the resultant vectorial motion.

Although there have been described above and illustrated in the drawings various forms and modifications in accordance with the invention, it will be appreciated that the invention is not limited thereto but encompasses all expedients within the scope of the appended claims.

What is claimed is:

1. A linear motor system for providing XY motions comprising:

a planar driver including sets of a number of energizing windings, the windings of each set having active lengths in the form of linear segments disposed to be solely along one of two orthogonal directions, the sets being disposed in a two-dimensional array with at least one set in each of the two orthogonal directions;

a planar magnetic structure, including a two-dimensional array of spaced apart magnetized poles thereon in a pattern substantially aligned with the two orthogonal directions;

means maintaining the driver and magnetic structure in opposed, substantially parallel relation during relative movement therebetween in two orthogonal directions; and means coupled to the energizing windings for energizing the windings of the two orthogonal directions separately and selectively with driver currents in accordance with relative position to generate thrusts in one or both of two orthogonal directions and relative motion between the driver and magnetic structure by interaction between the energized active lengths and the opposed magnetic structure.

2. The invention as set forth in claim 1 above, wherein the magnetic structure is substantially stationary and the driver is movable.

3. The invention as set forth in claim 2 above, wherein the driver comprises a platform having a central axis and at least four sets of driver windings disposed in quadrants about the central axis, the active lengths of windings in diagonally disposed quadrants having like orthogonality and wherein the magnetic structure comprises a sequence of poles of like magnetization along each direction of the array, with alternating magnetization between successive sequences.

4. The invention as set forth in claim 1 above, wherein the driver is substantially stationary and the magnetic structure is movable.

5. The invention as set forth in claim 4 above, wherein the magnetic structure comprises a platform having an array of poles of opposite magnetization thereon, and wherein the planar driver comprises a table having windings thereon in two orthogonal directions.

6. The invention as set forth in claim 1 above, wherein one of the driver and magnetic structure is movable and the other fixed, and further including means coupled to the fixed unit for sensing the position of the movable unit and controlling the means for energizing the windings.

7. The invention as set forth in claim 1 above, wherein the driver comprises a movable platform having a symmetrically placed center of gravity and the magnetic structure comprises a fixed table, and wherein the windings are disposed in quadrants about the center of gravity of the platform, with the active lengths of windings in diagonally disposed quadrants being similarly oriented such that relative rotational movement is imparted by differential energization of windings of like orthogonality.

8. The invention as set forth in claim 1 above, wherein the means maintaining the parallel relation comprises air bearing means coupled to one of the driver and magnetic structure and in air bearing relation with the other planar unit, and wherein the active lengths of windings of each set are parallel along a given direction for that set and the system further comprises means for commutating the signals to the windings of a set in accordance with the relative position between the windings and the magnetic poles.

9. The invention as set forth in claim 1 above, wherein the magnetic structure is stationary and comprises a magnetic base having a rectangular array disposed thereon of magnetized areas of polarity alternating between successive rows and columns and separated by non-magnetic areas, and further including a thin superimposed flat top surface of non-magnetic material facing the driver.

10. A system for positioning wafers with high precision, high speed and short settling times relative to the optical axis in a step and repeat system comprising:
    a flat table surface normal to and encompassing the optical axis;
    a platform disposed above the flat table surface and including air bearing means providing low friction support on the platform, the platform having its center of gravity in a plane close to the table surface and the air bearing means including a number of air bearing pads spaced apart about the center of gravity;
    linear motor means coupling the table surface to the platform, the linear motor means including winding means and permanent magnet means, with one being mounted on the platform facing the table surface and closely positioned relative to the plane of the center of gravity and the other being embedded in the table surface, the winding means comprising an array of orthogonally disposed linear active lengths of windings disposed such that forces generated by inductive reaction between active lengths of the same orthogonal direction and the permanent magnet means are exerted symmetrically relative to the plane of the center of gravity in the platform and are symmetrical and substantially perpendicular to an axis normal thereto;
    means for sensing the position of the platform relative to the table; and
    means for separately energizing the active lengths in each orthogonal direction in response to sensed position to provide controlled thrust on the platform.

11. The invention as set forth in claim 10 above, wherein the winding means is mounted on the underside of the platform and comprises at least one array of four linear multiple coil sets disposed in quadrants about the center of gravity, the active turns of coil sets in oppositely disposed quadrants being parallel and orthogonal to the active turns of coil sets in the remaining quadrants, and wherein the system includes means responsive to the sensed position for energizing the coil sets to control position of the platform relative to the table surface.

12. The invention as set forth in claim 11 above, wherein the table surface comprises an array of permanent magnet elements embedded in the table surface in a checkerboard pattern of columns and rows, the magnetic elements being of like polarity along the columns and rows, and the columns and rows alternating in polarity and conductive non-magnetic areas filling the spaces between the permanent magnet elements.

13. The invention as set forth in claim 12 above, wherein the multiple coil sets each have multiple active turn lengths lying in a nominal plane adjacent the table surface and the permanent magnet elements, wherein the areas of each coil set span more than one permanent magnet element, and wherein the system further includes means for commutating energizing signals applied to the turns in a coil set in accordance with the platform position for that axis.

14. The invention as set forth in claim 13 above, wherein the means for sensing the position of the platform includes at least two laser interferometer means, and means responsive to the inteferometer means for computing the instantaneous position of the platform.

15. A system for positioning a semiconductor wafer precisely in X and Y directions within a given horizontal plane comprising:
    a planar member having a flat upper surface including a plurality of embedded square outline permanent magnet elements disposed in rows and columns along X and Y axes, and a plurality of square outline non-magnetic separators disposed therebetween in alternating fashion in the rows and columns, the permanent magnet elements in individual columns and rows being of like polarity but the polarities of the elements in successive columns and rows alternating;
    a platform including air bearing means maintaining the platform at a predetermined height above the upper surface of the planar member, the platform having a predetermined center of gravity;
    four coil sets mounted in quadrants symmetrically about the center of gravity of the platform on the underside of the platform, the coil sets of one diagonally opposed pair having active linear lengths of turns disposed substantially along the X axis, and the coil sets of the other diagonally opposed pair having active lengths of turns disposed substantially along the Y axis, each coil set having multiple parallel subsets of turns and a square outline covering a predetermined number of magnetic elements and non-magnetic elements;
    means for sensing the position of the platform;
    means providing driving signals for the X and Y directions; and
    means responsive to the sensed position of the platform and the driving signals for commutating the driving signals in appropriate senses to the subsets of the turns of the coil sets to provide desired thrusts in the X and Y directions.

16. The invention as set forth in claim 15 above, wherein the coil sets each have an area equivalent to four of the magnetic elements and non-magnetic elements, and wherein the means for commutating constantly energizes a like number of subsets of a coil set such that constant thrust is exerted for a given driving current amplitude.

17. The invention as set forth in claim 16 above, wherein the coil sets each have six subsets and four are energized at a time when driving current is applied for the coil set.

18. The invention as set forth in claim 16 above, whrein the diagonally opposed subsets are energized in like fashion to generate balanced thrusts relative to the center of gravity of the platform.

19. The invention as set forth in claim 16 above, wherein at least one pair of diagonally opposed subsets are energized in differential fashion to induce angular motion of the platform relative to the X and Y directions.

20. A system for positioning a platform precisely in horizontal plane comprising:
a planar member having a flat upper surface lying in a horizontal plane, the planar member including a plurality of permanent magnet elements in a rectangular array, the elements being spaced apart and being of like polarity along the lines of the array, with polarity alternating along successive lines, the planar member including non-magnetic spacers between the permanent magnet elements;
a platform member including support means movably maintaining the platform member above the planar member at a selected spacing, the platform member including a number of coil sets disposed about the vertical axis of the center of gravity thereof, the coil sets having windings with active turns disposed only in one of two orthogonal, horizontal directions, the coil sets and permanent magnet elements having areas and spacings such that the active turns of the coil sets concurrently span like areas of oppositely poled permanent magnet elements; and
means coupled to the coil sets for energizing the coil sets to generate forces on the platform member to provide movement in any direction in the horizontal plane.

21. The invention as set forth in claim 20 above, wherein the coil sets comprise four substantially square outline coil sets disposed in quadrants about the vertical center of gravity of the platform, the active lengths of windings of one diagonally opposed pair being oriented in one direction and the active lengths of windings of the other diagonally opposed pair being oriented in the orthogonal direction, and wherein the permanent magnet elements are squares having sides one-half the length of the sides of the coil sets and spaced apart by a like distance, such that each coil set constantly is coextensive with equal areas of oppositely poled permanent magnet elements.

22. The invention as set forth in claim 21 above, wherein the coil sets each comprise a plurality of serially disposed windings at a predetermined pitch, the windings having active lengths disposed adjacent and parallel to the plane of the permanent magnet elements.

23. The invention as set forth in claim 22 above, wherein the coil sets include distributed polyphase windings and wherein the system further includes means for sensing the position of the platform and means coupled to the means for energizing and responsive to the sensed position position to commutate the driving signals between the windings of a coil set at increments corresponding to the predetermined pitch.

24. The invention as set forth in claim 23 above, wherein the distributed polyphase windings are Gramme windings having three phases and wherein the commutation switches the leading phase winding to zero when the leading winding is coextensive with permanent magnets of opposing polarity.

25. The invention as set forth in claim 23 above, wherein the distributed polyphase windings of each coil set comprise two groupings of windings, like windings in each three phase grouping being serially connected and oppositely wound such that opposite currents pass through them.

26. The invention as set forth in claim 20 above, wherein the planar member comprises a thick magnetic base supporting the permanent magnetic elements and providing a magnetic back plane therefor.

27. The invention as set forth in claim 26 above, wherein magnetic base is a cast iron structure having hollowed out portions, and wherein the system further comprises a flat non-magnetic surface member disposed over the permanent magnet elements adjacent the coil sets.

28. A system for positioning a platform precisely on a horizontal plane comprising:
a planar member having a plurality of windings in first and second sets with the active lengths of each set being disposed in only one of two orthogonal directions in a horizontal plane, the windings of the first and second sets intersecting throughout an area in which the platform is to be positioned;
platform means disposed and movable above the horizontal plane and including a number of permanent magnet elements in a preselected pattern of opposite polarities adjacent the horizontal plane that is substantially aligned with the two orthogonal directions; and
means for energizing the first and second sets of windings to exert thrusts on the platform means to the permanent magnet elements by interaction between the active lengths of the sets of windings and the permanent magnet elements.

29. The invention as set forth in claim 28 above, wherein the windings of the first and second sets each comprise a plurality of turns having a predetermined pitch and wherein the permanent magnet elements have sizes and spacings proportioned to the predetermined pitch.

30. The invention as set forth in claim 28 above, wherein the permanent magnet elements comprise a central square of one polarity having sides that are an integral multiple of the predetermined pitch, and a number of symmetrically positioned permanent magnet elements of opposite polarity positioned thereabout.

31. The invention as set forth in claim 30 above, wherein the system further includes means responsive to the position of the platform means for controlling the energization of selected sets of windings to generate desired thrusts on the platform means.

32. The invention as set forth in claim 31 above, wherein the permanent magnet elements of opposite polarity are squares having one-half the length per side of the permanent magnet element of one polarity and each is positioned adjacent a different corner of such permanent magnet element.

33. The invention as set forth in claim 31 above, wherein the platform means further includes a flux closure member adjacent the permanent magnet elements on the opposite side from the planar member.

* * * * *